United States Patent
Martine

(10) Patent No.: US 7,330,086 B2
(45) Date of Patent: Feb. 12, 2008

(54) ATTENUATOR ADAPTER

(75) Inventor: Joseph W. Martine, Lawrenceville, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 186 days.

(21) Appl. No.: 11/275,454

(22) Filed: Jan. 5, 2006

(65) Prior Publication Data

US 2006/0279375 A1 Dec. 14, 2006

Related U.S. Application Data

(60) Provisional application No. 60/595,127, filed on Jun. 8, 2005.

(51) Int. Cl.
*H03H 7/24* (2006.01)
(52) U.S. Cl. .................................. 333/81 R
(58) Field of Classification Search ............... 333/81 R
See application file for complete search history.

(56) References Cited

U.S. PATENT DOCUMENTS 3,924,207 A * 12/1975 Simoni ............. 333/81 R
4,220,834 A 9/1980 Holce
6,712,523 B2 * 3/2004 Zimmel .................. 385/72
2004/0090285 A1 5/2004 Eisenhart

FOREIGN PATENT DOCUMENTS

EP    1 148 600    10/2001
FR    2 557 382    6/1985

\* cited by examiner

*Primary Examiner*—Stephen E. Jones

(57) ABSTRACT

An attenuator pad adapter for utilizing a replacement attenuator pad in place of another attenuator pad intended for use on a printed circuit board. The attenuator pad adapter has a body portion with a plurality of pins extending from one of its ends that correspond with pins of the originally intended attenuator pad. A slot in an opposite end is configured to detachably receive an end of the replacement attenuator pad. Openings in the slot receive pins on an end of the replacement attenuator pad. The pins of the replacement attenuator pad electrically interconnect connect with the pins extending from the body portion of the attenuator pad adapter. The pins of the replacement attenuator pad are arranged differently than the pins extending from either the body portion or the originally intended attenuator pad.

14 Claims, 4 Drawing Sheets

ATTENUATOR ADAPTER

CROSS-REFERENCE TO RELATED APPLICATIONS

This application claims priority to U.S. provisional application Ser. No. 60/595,127 filed Jun. 8, 2005, which is incorporated herein by reference.

TECHNICAL FIELD

The present invention relates to attenuators for use with equipment such as optical transmitters and receivers in CATV nodes. More particularly, the present invention relates to an adapter for interchanging attenuators.

BACKGROUND OF THE INVENTION

In CATV nodes, such as Scientific-Atlanta's Gainmaker® node, optical devices such as transmitters and receivers use attenuator pads which change the power level of RF signals. Typically these known attenuator pads are round as shown in FIG. 1. However, some optical devices such as a launch amplifier use square attenuator pads as shown in FIG. 2. Both the round and square attenuator pads have three pins for electrically and mechanically coupling the attenuator pads to a printed circuit board. However, the three pins of the square attenuator pad are aligned with one another in a straight line whereas the three pins of the round attenuator are arranged in a triangular pattern. Therefore, the round and square attenuators have different footprints and necessarily fit into different sockets on a printed circuit board.

FIG. 3 illustrates a pad guide for use with the round attenuator pad of FIG. 1. The pad guide of FIG. 3 preferably has an opening therethrough that has an inner diameter that corresponds with the outer diameter of the round attenuator pad of FIG. 1. However, the opening through some pad guides only extends partially through the center of these pad guides, but then allows the three pins of the round attenuator pad to extend through the bottom of the pad guide to the exterior of the pad guide.

Pad guides also typically include resilient hooked portions or prongs which extend outward from the bottom of the pad guide. The resilient hooked portions or prongs allow the pad guide to be mechanically mounted to a printer circuit board that has openings therethrough which correspond with each of the hooked portions. The manner in which the hooked portions extend into the openings in the printed circuit in order to mechanically mount the pad guide board may be referred to as a snap or friction fit. Pad guide may be configured differently to include other means for mounting to the printed circuit board. For example, any number of prongs may be used and an opening in a printed circuit board may be configured to accommodate more than one prong.

BRIEF DISCRIPTION OF THE DRAWINGS

FIG. 7 illustrates a perspective view of the attenuator pad adapter about to be mounted to a printed circuit board and the square attenuator pad about to be mounted to the top of the attenuator pad adapter according to one embodiment of the present invention.

DETAILED DESCRIPTION

The present invention will be described more fully hereinafter with reference to the accompanying drawings in which like numerals represent like elements throughout the several figures, and in which an exemplary embodiment of the invention is shown. This invention may, however, be embodied in many different forms and should not be construed as being limited to the embodiments set forth herein; rather, the embodiments are provided so that this disclosure will be thorough and complete, and will fully convey the scope of the invention to those skilled in the art. The present invention is described more fully hereinbelow.

Figure 4:
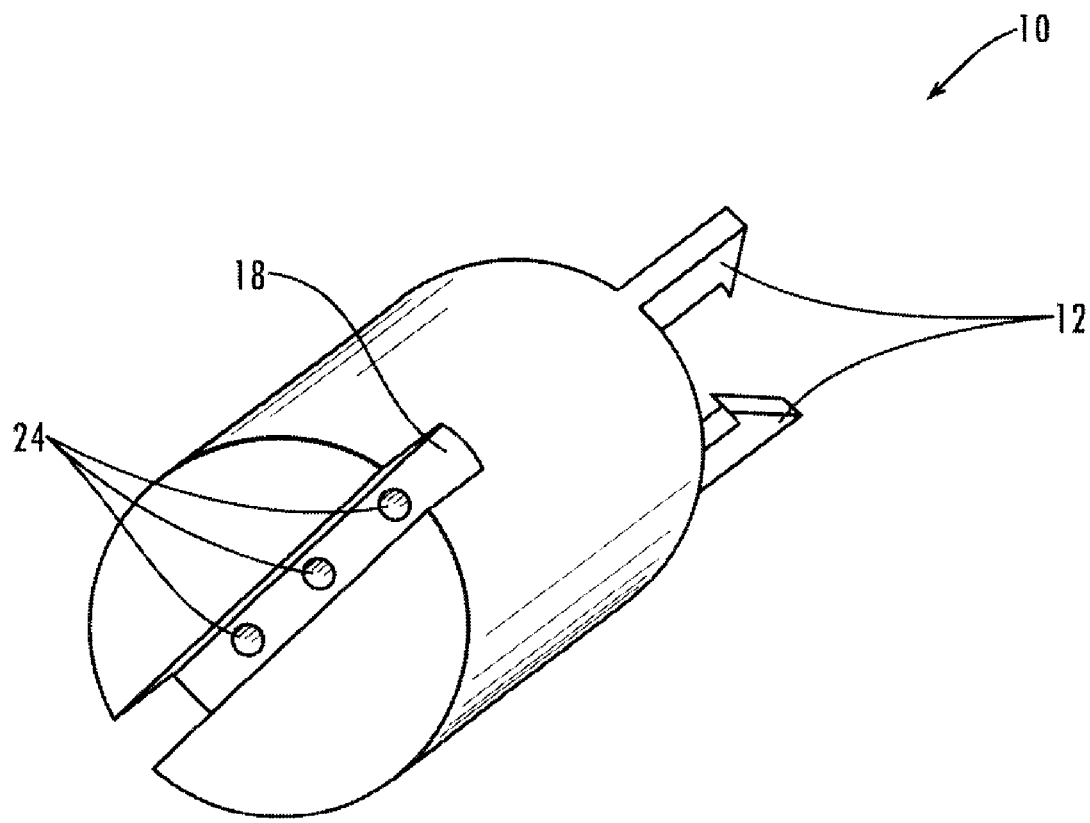
FIG. 4 illustrates a perspective view of the top of an attenuator pad adapter according to one embodiment of the present invention for use with the square attenuator pad of FIG. 2.

In order to have a common pad shape in a CATV node or other product and to reduce the number of different attenuator pads a customer would need, an adapter is needed that can be placed into the socket within the footprint of a round attenuator pad, but then allow a square attenuator pad to be used in place of a round attenuator pad. FIG. 4 illustrates one embodiment of an attenuator pad adapter 10 of the present invention. The attenuator pad adapter 10 allows a square attenuator pad with a JXP footprint to be used on any printed circuit board with a round attenuator pad footprint.

The attenuator pad adapter 10 has a body portion that is preferably made of molded plastic that is the same diameter as a round attenuator pad. However, the attenuator pad adapter 10 may be any shape so long as the bottom includes three pins arranged in a manner similar to the three pins a round attenuator pad would have. The bottom perimeter of the body portion of the attenuator pad adapter 10 also preferably includes optional resilient hooked portions 12 or prongs like the pad guide described above. The hooked portions 12 correspond with the footprint on a printed circuit board for receiving a pad guide. However, the attenuator pad adapter 10 may utilize other means for securing itself to a printed circuit board such as those typically used for securing known pad guides.

Figure 1:
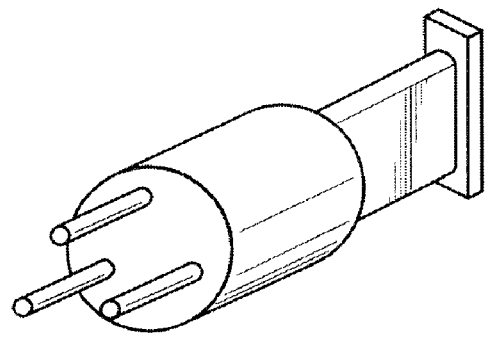
FIG. 1 illustrates a perspective view of a prior art attenuator pad that is round in shape.
Figure 2:
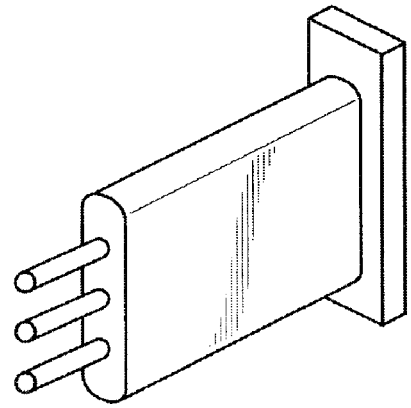
FIG. 2 illustrates a perspective view of a prior art attenuator pad that is square in shape.
Figure 3:
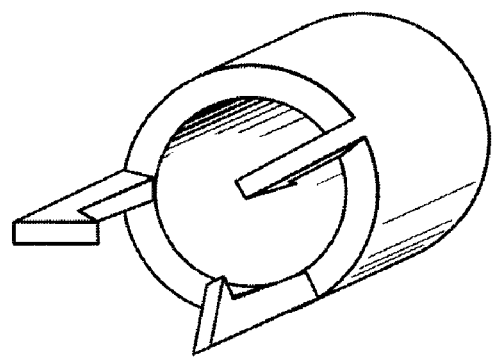
FIG. 3 illustrates a perspective view of a prior art pad guide for use with the round attenuator pad of FIG. 1.
Figure 5:
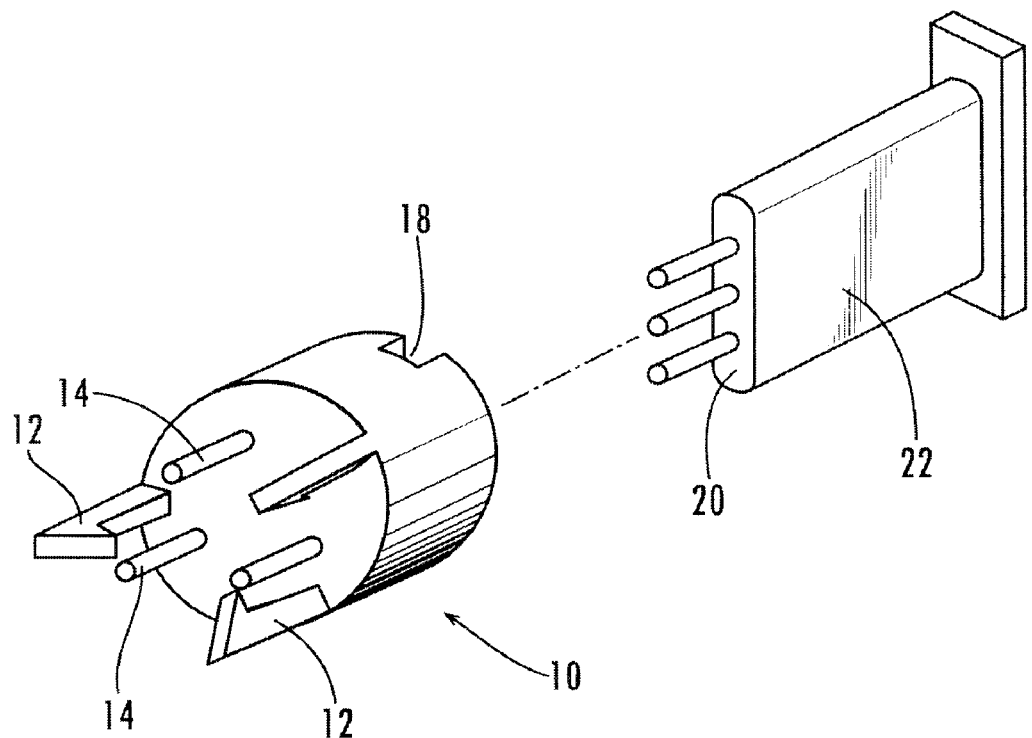
FIG. 5 illustrates a perspective view of the square attenuator pad of FIG. 2 separated from the attenuator pad adapter of FIG. 4.
Figure 6:
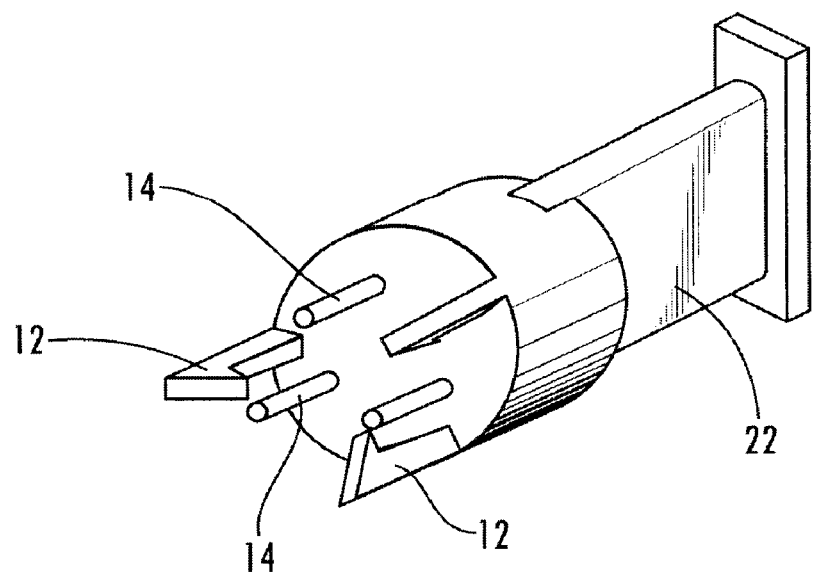
FIG. 6 illustrates a perspective view of the attenuator pad adapter connected with the square attenuator pad of FIG. 2 according to one embodiment of the present invention.
Figure 1:
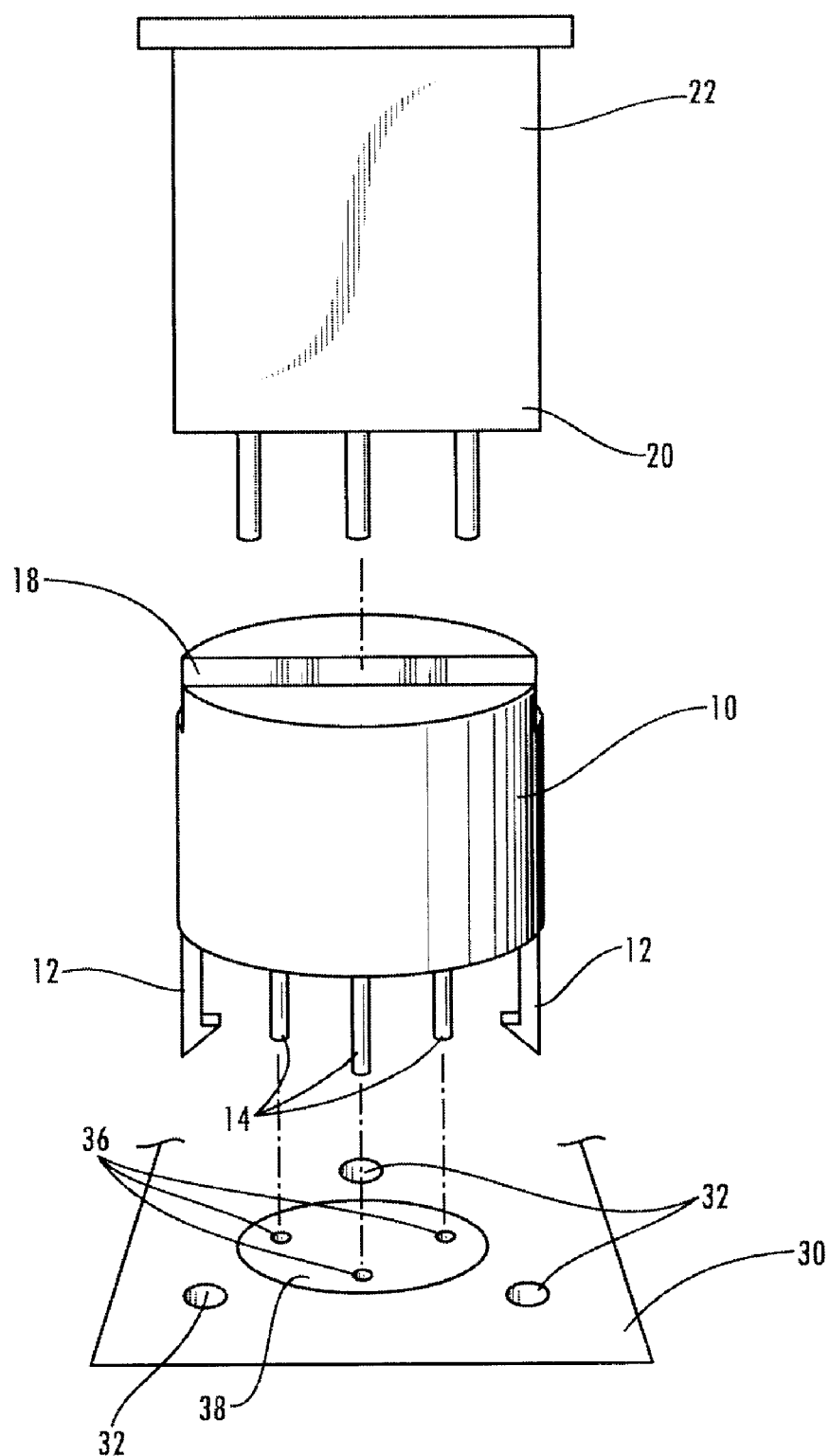

The bottom of the attenuator pad adapter 10 also includes pins 14 for electrically and mechanically coupling with the printed circuit board. As best shown in FIGS. 5 and 6, the pins 14 are arranged as to correspond with the arrangement of the pins of the round attenuator pad of FIG. 1 and, therefore, the pins 14 correspond with the footprint of a round attenuator pad.

The top of the attenuator pad adapter 10 includes an optional slot 18 for detachably receiving the end 20 of the square attenuator pad 22. The attenuator pad adapter 10 also includes three sockets or openings 24, preferably within the slot 18 when the slot 18 is present, that are configured to receive the pins 26 of the square attenuator pad 22. When the slot 18 is not present, the openings 24 are arranged on the top of the attenuator pad adapter 10. The openings 24 match the industry standard JXP footprint for receiving square attenuator pads and each of the openings 24 connect internally with one of the three pins 14 on the bottom of the attenuator pad adapter 10.

FIG. 7 illustrates a perspective view of the attenuator pad adapter 10 about to be detachably mounted to a printed circuit board 30 along with the square attenuator pad 22 about to be detachably mounted to the top of the attenuator pad adapter 10 according to one embodiment of the present invention. The hooked portions 12 of the attenuator pad adapter 10 detachably mount into corresponding optional openings 32 for mechanically securing the attenuator pad adapter 10 to the printed circuit board 30. The openings 32 in the printed circuit board 30 correspond with the hooked portions or prongs of a pad guide if one were to have been used. The pins 14 of the attenuator pad adapter 10 electrically and mechanically mount the attenuator pad adapter 10 to the printed circuit board 30 when received in openings 36. The openings 36 in the printed circuit board 30 are configured to define a socket within a footprint 38 for receiving a round attenuator pad.

The foregoing has broadly outlined some of the more pertinent aspects and features of the present invention. These should be construed to be merely illustrative of some of the more prominent features and applications of the invention. Other beneficial results can be obtained by applying the disclosed information in a different manner or by modifying the disclosed embodiments. Accordingly, other aspects and a more comprehensive understanding of the invention may be obtained by referring to the detailed description of the exemplary embodiments taken in conjunction with the accompanying drawings, in addition to the scope of the invention defined by the claims.

What is claimed is:

1. An attenuator pad adapter for utilizing a first attenuator pad in place of a second attenuator pad on a printed circuit board, wherein said first and second attenuator pads are shaped differently, said attenuator pad adapter comprising:
    a body portion having first and second opposite ends;
    a plurality of pins extending from said first end;
    a plurality of openings in said second end of said body portion for receiving pins on an end of said first attenuator pad, said pins of said first attenuator pad arranged differently than said pins extending from said first end of said body portion, and said openings in said second end of said body portion allowing said pins of said first attenuator pad to electrically connect with said pins extending from said first end of said body portion of said attenuator pad adapter.

2. The attenuator pad adapter of claim 1 wherein said plurality of pins extending from said first end of said body portion of said attenuator pad adapter correspond with pins of said second attenuator pad.

3. The attenuator pad adapter of claim 1 wherein said first attenuator pad is square and said second attenuator pad is round.

4. The attenuator pad adapter of claim 1 wherein said openings in said second end of said body portion are arranged to correspond with a JXP footprint.

5. The attenuator pad adapter of claim 1 wherein said body portion is round.

6. The attenuator pad adapter of claim 1 wherein said body portion comprises a plurality of resilient hook portions.

7. The attenuator pad adapter of claim 6 wherein said resilient hook portions correspond with a footprint on the printed circuit board for receiving a pad guide.

8. The attenuator pad adapter of claim 1 further comprising a slot in said second end for detachably receiving said end of said first attenuator pad.

9. The attenuator pad adapter of claim 8 wherein said plurality of openings in said second end of said body portion are arranged within said slot for receiving said pins of said first attenuator pad when said end of said first attenuator pad is detachably received within said slot.

10. An attenuator pad adapter for utilizing a square attenuator pad in place of a round attenuator pad on a printed circuit board, said attenuator pad adapter comprising:
    a body portion having first and second opposite ends;
    a plurality of pins extending from said first end;
    a slot in said second end for detachably receiving an end of said square attenuator pad; and
    a plurality of openings in said slot for receiving pins on said end of said square attenuator pad, said pins of said square attenuator pad arranged differently than said pins extending from said first end of said body portion, and said openings allowing said pins of said square attenuator pad to electrically connect with said pins extending from said first end of said body portion of said attenuator pad adapter.

11. The attenuator pad adapter of claim 10 wherein said plurality of pins extending from said first end of said body portion of said attenuator pad adapter correspond with pins of said round attenuator pad.

12. The attenuator pad adapter of claim 10 wherein said body portion comprises a plurality of resilient hook portions.

13. The attenuator pad adapter of claim 12 wherein said resilient hook portions correspond with a footprint on the printed circuit board for receiving a pad guide.

14. A method for utilizing a replacement attenuator pad in place of another attenuator pad intended for use on a printed circuit board where the other attenuator pad is configured differently from said replacement attenuator pad, said method comprising the steps of:
    mounting said replacement attenuator pad to a body portion of an attenuator pad adapter;
    electrically interconnecting pins extending from said body portion of said attenuator pad adapter to pins extending from said replacement attenuator pad; and
    receiving said pins extending from said body portion of said attenuator pad adapter within a footprint of the printed circuit board configured for said other attenuator pad.

* * * * *